(12) United States Patent
Wang et al.

(10) Patent No.: US 8,924,896 B2
(45) Date of Patent: Dec. 30, 2014

(54) AUTOMATED DESIGN LAYOUT PATTERN CORRECTION BASED ON CONTEXT-AWARE PATTERNS

(71) Applicants: Lynn Wang, Fremont, CA (US); Vito Dai, Santa Clara, CA (US); Luigi Capodieci, Santa Cruz, CA (US)

(72) Inventors: Lynn Wang, Fremont, CA (US); Vito Dai, Santa Clara, CA (US); Luigi Capodieci, Santa Cruz, CA (US)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 13/755,374

(22) Filed: Jan. 31, 2013

(65) Prior Publication Data
US 2014/0215415 A1    Jul. 31, 2014

(51) Int. Cl.
*G06F 17/50* (2006.01)

(52) U.S. Cl.
CPC ...................................... *G06F 17/50* (2013.01)
USPC .................... 716/54; 716/51; 716/52; 716/56

(58) Field of Classification Search
USPC .......................................... 716/51–52, 54, 56
See application file for complete search history.

(56) References Cited

U.S. PATENT DOCUMENTS

| | | | | |
|---|---|---|---|---|
| 5,048,094 A * | 9/1991 | Aoyama et al. | ................ | 382/151 |
| 7,031,511 B2 * | 4/2006 | Asai | ................ | 382/149 |
| 7,070,889 B2 * | 7/2006 | Ohashi et al. | ................ | 430/5 |
| 7,305,645 B1 * | 12/2007 | Capodieci et al. | ............ | 716/129 |
| 7,418,693 B1 * | 8/2008 | Gennari et al. | .................. | 716/55 |
| 7,587,704 B2 * | 9/2009 | Ye et al. | .......................... | 716/51 |
| 7,653,890 B2 * | 1/2010 | Tsai et al. | ........................ | 716/55 |
| 7,711,514 B2 * | 5/2010 | Park et al. | ...................... | 702/123 |
| 7,735,053 B2 * | 6/2010 | Harazaki | ......................... | 716/53 |
| 7,757,190 B2 * | 7/2010 | Dai et al. | ......................... | 716/52 |
| 7,765,515 B2 * | 7/2010 | Ying | ................. | 716/52 |
| 7,818,707 B1 * | 10/2010 | Gennari et al. | ................. | 716/53 |
| 8,037,428 B2 * | 10/2011 | Tong et al. | ...................... | 716/51 |
| 8,381,152 B2 * | 2/2013 | Lai et al. | ........................ | 716/110 |
| 8,402,397 B2 * | 3/2013 | Robles et al. | .................... | 716/52 |
| 8,453,087 B2 * | 5/2013 | Teoh | ............................ | 716/110 |
| 8,453,089 B2 * | 5/2013 | Teoh et al. | ...................... | 716/113 |
| 8,555,215 B2 | 10/2013 | Zou et al. | | |
| 2009/0307642 A1 * | 12/2009 | Lai et al. | ........................... | 716/5 |

OTHER PUBLICATIONS

Dai et al "DRC Plus: Augmenting Standard DRC with Pattern Matching on 2D Geometries", Proc. of SPIE, vol. 6521, 65210A, 2007, 12 pages.
Wang et., "Pattern Matching for Double Patterning Technology-Compliant Physical Design Flows", Proc. of SPIE, vol. 8327, 832708, Mar. 15, 2012, 9 pages.

* cited by examiner

*Primary Examiner* — Naum Levin
(74) *Attorney, Agent, or Firm* — Ditthavong & Steiner, P.C.

(57) ABSTRACT

A process and apparatus are provided for automated pattern-based semiconductor design layout correction. Embodiments include scanning a drawn semiconductor design layout to determine a difficult-to-manufacture pattern within the drawn semiconductor design layout based on a match with a pre-characterized difficult-to-manufacture pattern, determining a corrected pattern based on a pre-determined correlation between the corrected pattern and the pre-characterized difficult-to-manufacture pattern, and replacing the difficult-to-manufacture pattern with the corrected pattern within the drawn semiconductor design layout.

16 Claims, 14 Drawing Sheets

AUTOMATED DESIGN LAYOUT PATTERN CORRECTION BASED ON CONTEXT-AWARE PATTERNS

TECHNICAL FIELD

The present disclosure relates to creating semiconductor design layouts. The present disclosure is particularly applicable to correcting difficult-to-manufacture patterns in drawn semiconductor design layouts.

BACKGROUND

Difficult-to-manufacture patterns within semiconductor design layouts include those which generate design rule check errors, lithography printability errors, double patterning technology-compliance check errors, design for manufacturability (DFM) rule check errors, etc. Existing solutions for resolving difficult-to-manufacture patterns generally fall into two categories: hand-drawn fixes and automated rule-based fixes.

Hand-drawn fixes are manual fixes that are made by a layout designer using a computer-aided design (CAD) tool. Guidance on fixing difficult-to-manufacture patterns is provided in the form of error markers with annotations generated by a rule-checking engine. Layout designers must iteratively modify the designs until all checks are passed. Consequently, hand-drawn fixes lack consistency as they rely on a human operator or designer to correct identical errors in the same exact manner, thus inducing variability in the final manufactured product.

Automated rule-based fixes are created by a manipulation engine that, through a group of coded rules, identifies the difficult-to-manufacture geometries and generates new geometries to replace them. The coded rules search for features based on a sequence of polygonal or edge based measurement commands. Consequently, each additional dimensional constraint or measurement incurs additional computation time and complexity. Comprehensive, rule-based scripts are required for automated rule-based fixes, which can be difficult to code, particularly for complex layout patterns. A pattern with N edges may be represented by N*(N−1) edge-pair constraints. Thus, it is impractical to implement approximately N*(N−1) coded rules per pattern.

A pattern-based methodology is an effective alternative to both of the above solutions when used to identify complex, difficult-to-manufacture layout patterns, such as those which cause lithography hotspots. However, once a hotspot is identified through pattern matching, fixing the layout still requires manual effort.

A need therefore exists for a methodology allowing for automated context-aware pattern-based semiconductor design layout correction.

SUMMARY

An aspect of the present disclosure is a methodology enabling automated pattern-based semiconductor design layout correction.

Another aspect of the present disclosure is an apparatus capable of performing automated pattern-based semiconductor design layout correction.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: scanning a drawn semiconductor design layout to determine a difficult-to-manufacture pattern within the drawn semiconductor design layout based on a match with a pre-characterized difficult-to-manufacture pattern, determining a corrected pattern based on a predetermined correlation between the corrected pattern and the pre-characterized difficult-to-manufacture pattern, and replacing the difficult-to-manufacture pattern with the corrected pattern within the drawn semiconductor design layout.

Aspects of the present disclosure include determining a context of the difficult-to-manufacture pattern within the drawn semiconductor design layout and determining the corrected pattern based on the context. Additional aspects include determining the context includes determining neighboring features of the difficult-to-manufacture pattern and determining the corrected pattern includes accounting for the neighboring features. Another aspect includes determining an extraction radius for determining the neighboring features of the difficult-to-manufacture pattern, the extraction radius being based on a radius of influence of manufacturing effects. Yet another aspect includes the difficult-to-manufacture pattern including polygonal data or image data. Additional aspects include determining the pre-determined correlation based on candidate corrected patterns that fix respective candidate difficult-to-manufacture patterns and storing the candidate corrected patterns with the respective candidate difficult-to-manufacture patterns as correlated corrected patterns and pre-characterized difficult-to-manufacture patterns. Still another aspect includes determining whether a candidate corrected pattern fixes a candidate difficult-to-manufacture pattern based on correction of an original violation of the candidate difficult-to-manufacture pattern and a determination of no additional manufacturing faults generated by the candidate corrected pattern. Another aspect includes the manufacturing faults being manufacturing faults at a boundary of an extraction radius, the extraction radius being based on the radius of influence of the manufacturing effects. Yet another aspect includes the difficult-to-manufacture pattern including at least one of a line-end extension hotspot, an active area-tuck hotspot, a cut-mask generation hotspot, a lithography hotspot, a double patterning technology issue, and an optical proximity correction optimization.

Another aspect of the present disclosure is an apparatus including: at least one processor, and at least one memory including computer program code for one or more programs, the at least one memory and the computer program code configured to, with the at least one processor, cause the apparatus to perform at least the following: scan a drawn semiconductor design layout to determine a difficult-to-manufacture pattern within the drawn semiconductor design layout based on a match with a pre-characterized difficult-to-manufacture pattern, determine a corrected pattern based on a predetermined correlation between the corrected pattern and the pre-characterized difficult-to-manufacture pattern, and replace the difficult-to-manufacture pattern with the corrected pattern within the drawn semiconductor design layout.

Aspects of the present disclosure include the apparatus being further caused to determine a context of the difficult-to-manufacture pattern within the drawn semiconductor design layout and determine the corrected pattern based on the context. Additional aspects include the apparatus being further caused to determine the context by determining neighboring features of the difficult-to-manufacture pattern and determining the corrected pattern by accounting for the neighboring features. Another aspect includes the apparatus being further caused to determine an extraction radius for determining the neighboring features of the difficult-to-manufacture pattern, the extraction radius being based a radius of influence of manufacturing effects. Yet another aspect includes the difficult-to-manufacture pattern including polygonal data or image data. Additional aspects include the apparatus being further caused to determine the pre-determined correlation based on candidate corrected patterns that fix respective candidate difficult-to-manufacture patterns and store the candidate corrected patterns with the respective candidate difficult-to-manufacture patterns as correlated corrected patterns and pre-characterized difficult-to-manufacture patterns. Still another aspect includes the apparatus being further caused to determine whether a candidate corrected pattern fixes a candidate difficult-to-manufacture pattern based on correction of an original violation of the candidate difficult-to-manufacture pattern and a determination of no additional manufacturing faults generated by the candidate corrected pattern. Another aspect includes the manufacturing faults being manufacturing faults at a boundary of an extraction radius, the extraction radius being based on the radius of influence of the manufacturing effects. Yet another aspect includes the difficult-to-manufacture pattern including at least one of a line-end extension hotspot, an active area-tuck hotspot, a cut-mask generation hotspot, a lithography hotspot, a double patterning technology issue, and an optical proximity correction optimization.

Another aspect of the present disclosure is a method including scanning a drawn semiconductor design layout to determine a difficult-to-manufacture pattern within the drawn semiconductor design layout, determining a match between the difficult-to-manufacture pattern and a pre-characterized difficult-to-manufacture pattern, determining an extraction radius associated with the difficult-to-manufacture pattern, extracting a portion of the drawn semiconductor design layout based on the extraction radius and the difficult-to-manufacture pattern, and replacing the extracted portion with a corrected portion based on the pre-characterized difficult-to-manufacture pattern.

Aspects of the present disclosure further include replacing the difficult-to-manufacture pattern within the extracted portion with a corrected pattern, performing a check on the corrected pattern within the extracted portion to ensure a violation associated with the difficult-to-manufacture pattern is corrected, and performing another check on the corrected pattern within the extracted portion to ensure no new manufacturing faults are generated.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of error generation attendant upon manual correction of difficult-to-manufacture semiconductor layout patterns and difficult coding attendant upon automated rule-based correction of such layout patterns. In accordance with embodiments of the present disclosure, a layout correction platform 100 provides for an automated context-aware pattern-based layout-fixing methodology. The layout correction platform 100 may scan a drawn semiconductor design layout for difficult-to-manufacture patterns that have been pre-characterized and stored according to correlations with corrected patterns. Once a match is found between difficult-to-manufacture patterns in the layout design and pre-characterized difficult-to-manufacture patterns, the correlated corrected patterns associated with the pre-characterized difficult-to-manufacture patterns may be inserted into the layout design in place of the difficult-to-manufacture patterns.

Methodology in accordance with embodiments of the present disclosure includes scanning a drawn semiconductor design layout to determine a difficult-to-manufacture pattern within the drawn semiconductor design layout based on a match with a pre-characterized difficult-to-manufacture pattern. Next, a corrected pattern may be determined based on a predetermined correlation between the corrected pattern and the pre-characterized difficult-to-manufacture pattern. After, the difficult-to-manufacture pattern is replaced with the corrected pattern within the drawn semiconductor design layout.

Figure 1:
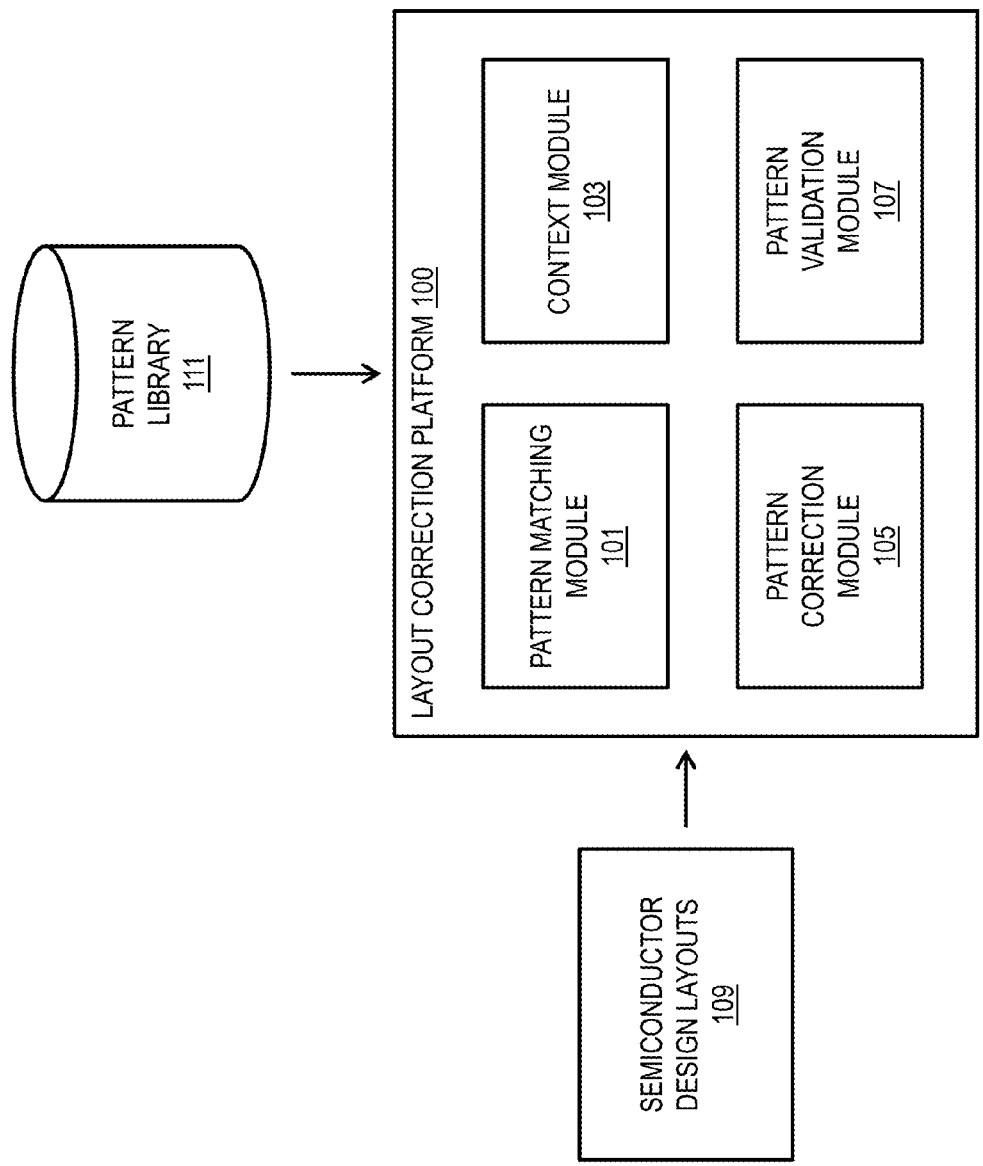
FIG. 1 illustrates a layout correction platform that may perform the automated context-aware pattern-based semiconductor design layout correction, in accordance with an exemplary embodiment.

FIG. 1 illustrates a layout correction platform 100 that may perform the automated context-aware pattern-based semiconductor design layout correction, in accordance with an exemplary embodiment. The layout correction platform 100 may receive one or more drawn semiconductor design layouts 109 through one or more databases and/or applications associated with storing and/or creating the drawn semiconductor design layouts 109. The layout correction platform 100 is further connected to or in communication with a pattern library 111. The pattern library 111 stores the pre-characterized difficult-to-manufacture patterns that are used by the layout correction platform 100 using one or more pattern matching engines and respective corrected patterns to replace difficult-to-manufacture patterns found in drawn semiconductor design layouts. The corrected patterns may be stored in correlation with pre-determined difficult-to-manufacture patterns. The pre-determined difficult-to-manufacture patterns may also have similar difficult-to-manufacture patterns that vary based on neighboring features to account for the context of the difficult-to-manufacture patterns.

The layout correction platform 100 may include a pattern matching module 101, a context module 103, a pattern correction module 105 and a pattern validation module 107. The pattern matching module 101 scans the drawn semiconductor design layouts for one or more difficult-to-manufacture patterns within the layouts. The pattern matching module 101 may detect the difficult-to-manufacture patterns within the layouts by comparing patterns within the layouts to pre-characterized difficult-to-manufacture patterns. The pre-characterized difficult-to-manufacture patterns may be stored within the pattern library 111 and be pre-determined and classified.

The context module 103 may determine the context of the difficult-to-manufacture patterns within the layouts. The context of the difficult-to-manufacture patterns may be used to account for features within the layouts that are near the difficult-to-manufacture pattern and that may affect correction of the difficult-to-manufacture pattern. For instance, the context of the difficult-to-manufacture pattern may be considered to determine whether the correction of the difficult-to-manufacture pattern cures the original violations associated with the difficult-to-manufacture pattern without introducing other violations.

The pattern correction module 105 corrects the determined difficult-to-manufacture patterns by deleting the difficult-to-manufacture patterns from the layout as determined from the pattern matching module 101 and inserting the corrected pattern. The corrected pattern may be retrieved from the pattern library 111 as being correlated to the pre-characterized difficult-to-manufacture pattern that was used to determine the difficult-to-manufacture pattern from within the layout. The pattern correction module 105 may further account for the context received from the context module 103 for determining the corrected pattern to insert for the difficult-to-manufacture pattern.

Once the corrected pattern is inserted into the drawn semiconductor design layout, the pattern validation module 107 may validate the correction by determining that the original violation associated with the difficult-to-manufacture pattern is corrected and that no new manufacturing faults are generated as a result of the correction. As discussed in detail below, the pattern validation module 107 may perform design rule checks and/or boundary checks to ensure that the original violations are corrected without introducing any new manufacturability-check violations. The pattern validation module 107 may also determine the corrected patterns to correlate with the pre-characterized, as discussed in detail below.

Figure 2:
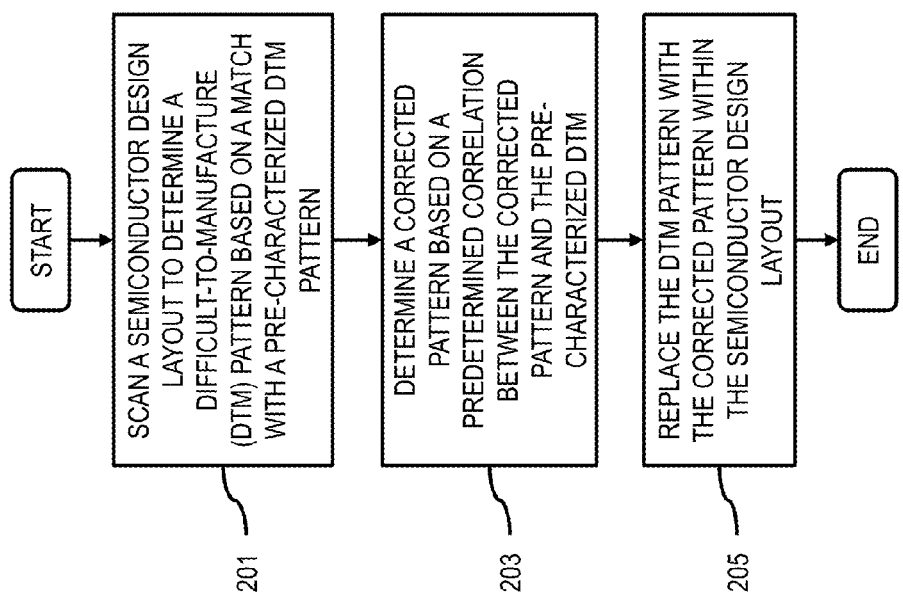
FIG. 2 is a flowchart of a process for automated pattern-based semiconductor design layout correction, in accordance with an exemplary embodiment.
Figure 14:
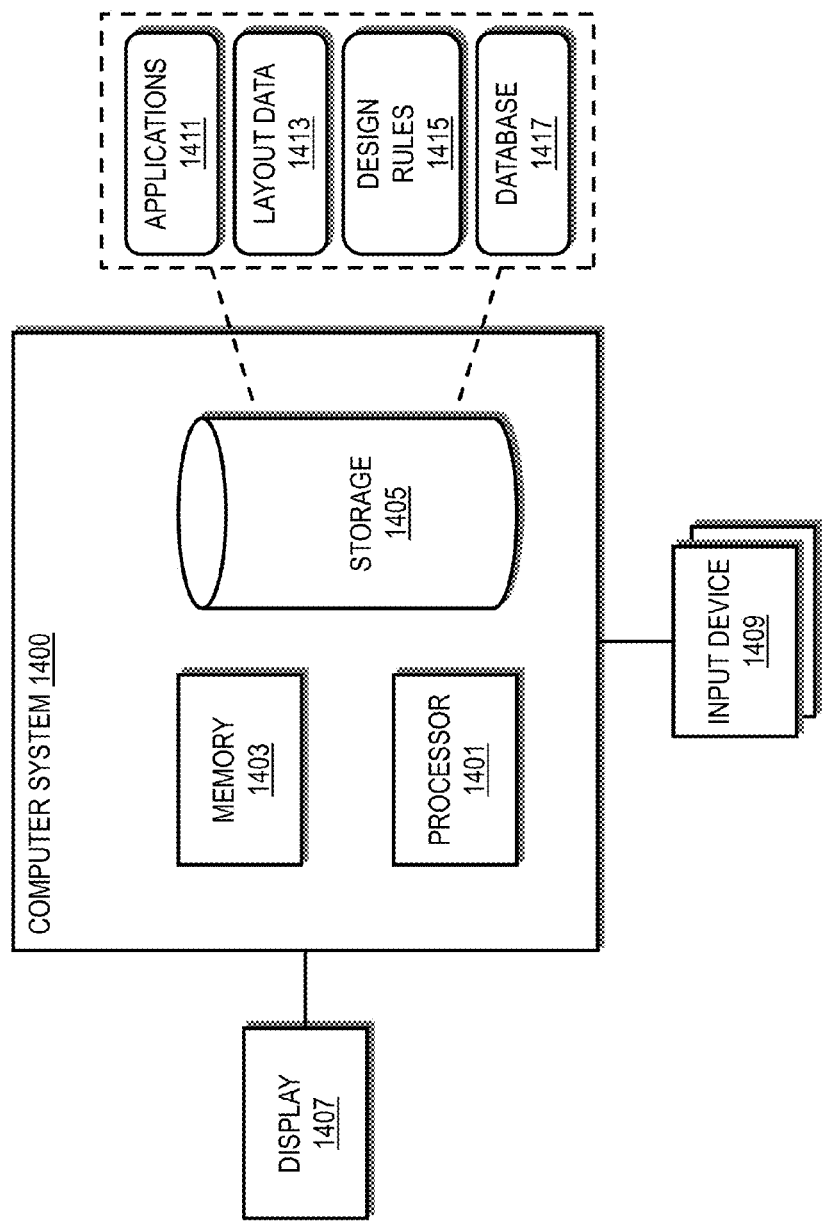
FIG. 14 schematically illustrates a computer system for implementing the processes of FIGS. 2 through 4, according to an exemplary embodiment.

FIG. 2 is a flowchart of a process for automated pattern-based design layout correction, according to an exemplary embodiment. For the process of FIG. 2, the layout correction platform 100 performs the process and is implemented in, for instance, a chip set including a processor and a memory as shown in FIG. 14.

In step 201, the layout correction platform 100 scans a drawn semiconductor design layout to determine a difficult-to-manufacture pattern within the drawn semiconductor design layout based on a match with a pre-characterized difficult-to-manufacture pattern. The layout correction platform 100 may receive the layouts from one or more applications used in designing the layouts, or from one or more databases that store the layouts. The layout correction platform 100 may use one or more pattern matching engines (e.g., within the pattern matching module 101) to scan for and determine a difficult-to-manufacture pattern within the layout. The patterns within the layout may be represented by polygonal or image data and, therefore, do not need to be coded based on one or more rules. The difficult-to-manufacture patterns are determined by matching patterns within the layout with a pre-characterized difficult-to-manufacture pattern. The pre-characterized difficult-to-manufacture patterns may be stored within the pattern library 111. The pre-characterized difficult-to-manufacture patterns may represent line-end extension hotspots, active area-tuck hotspots, cut-mask generation hotspots, lithography hotspots, double patterning technology issues, optical proximity correction optimizations, and the like.

At step 203, the layout correction platform 203 determines a corrected pattern based on a pre-determined correlation between the corrected pattern and the pre-characterized difficult-to-manufacture pattern. The pre-characterized difficult-to-manufacture patterns may be stored within the pattern library 111 correlated to corrected patterns. The corrected patterns are known fixes to the pre-characterized difficult-to-manufacture patterns. The corrected patterns may be manually generated or automatically generated, and with the respective pre-determined difficult-to-manufacture patterns, stored in the pattern library 111, as discussed more with respect to FIG. 4.

At step 205, the layout correction platform 100 replaces the difficult-to-manufacture pattern with the corrected pattern within the drawn semiconductor design layout. The applied corrected pattern corrects the violation within the drawn semiconductor design layout without generating any new violations or manufacturing faults. For example, the layout correction platform 100 may be context-aware such that the corrected pattern does not change the layout outside of an extraction area to ensure that introduction of the corrected pattern does not introduce any new violations.

Accordingly, by applying the corrected pattern to the layout, the layout correction platform 100 provides an automated semiconductor design layout correction methodology that is pattern-based and that ensures the layout correction is applied to the difficult-to-manufacture pattern within a set extraction radius to prevent any unintentional changes to the design. By using a pattern detection methodology, the layout correction platform 100 is not subject to coding errors or unintended layout modifications, thus reducing the design cycle time and improving the yield of the semiconductor design layout over previous difficult-to-manufacture layout-fixing methodologies. The automated pattern-based methodology also ensures consistent implementation of corrected patterns, which may be more consistent than manual, hand-drawn fixes that may vary as a result of different human operators or designers and additional verification burdens.

Figure 3:
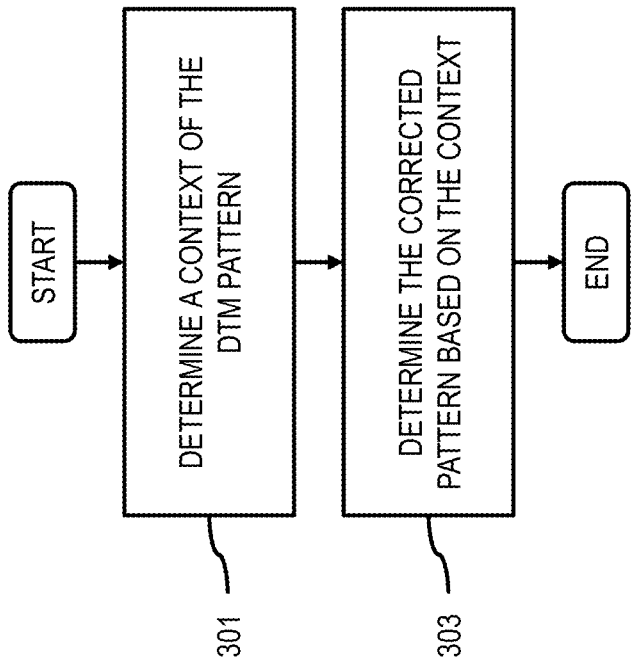
FIG. 3 is a flowchart of a process for context-aware automated pattern-based semiconductor design layout correction, in accordance with an exemplary embodiment.

FIG. 3 is a flowchart of a process for context-aware automated pattern-based semiconductor design layout correction, according to an exemplary embodiment. For the process of FIG. 3, the layout correction platform 100 performs the process and is implemented in, for instance, a chip set including a processor and a memory as shown in FIG. 14.

In step 301, the layout correction platform 100 determines a context of the difficult-to-manufacture pattern within the semiconductor design layout. The layout correction platform 100 determines the context of the difficult-to-manufacture pattern by determining the neighboring features of the difficult-to-manufacture pattern. By extracting the difficult-to-manufacture pattern along with neighboring features, the layout correction platform 100 may correct the difficult-to-manufacture pattern without introducing new manufacturing faults that may be caused by the corrected pattern interacting with the neighboring features. To determine what features are considered neighboring features of the difficult-to-manufacture pattern, the layout correction platform 100 may determine an extraction radius. The extraction radius may account for a distance away from the difficult-to-manufacture pattern that the layout correction platform 100 considers when determining a corrected pattern. The extraction radius may vary for different manufacturing effects associated with difficult-to-manufacture patterns. For example, for lithography hotspots, the extraction radius may be the optical radius. For double patterning decomposition-algorithm-related escapes, the extraction radius may be four times the feature size.

In step 303, the layout correction platform 100 determines the corrected pattern based on the determined context. By determining the corrected pattern based on the determined context, the layout correction platform 100 may account for the neighboring features to prevent the corrected pattern from introducing a manufacturing fault when interacting with the neighboring features. The corrected patterns may be stored within the pattern library 111 correlated with the pre-determined difficult-to-manufacture patterns. Based on the neighboring features within the extraction radius, the combination of the neighboring features and the difficult-to-manufacture pattern is used to determine the corrected pattern.

Figure 4:
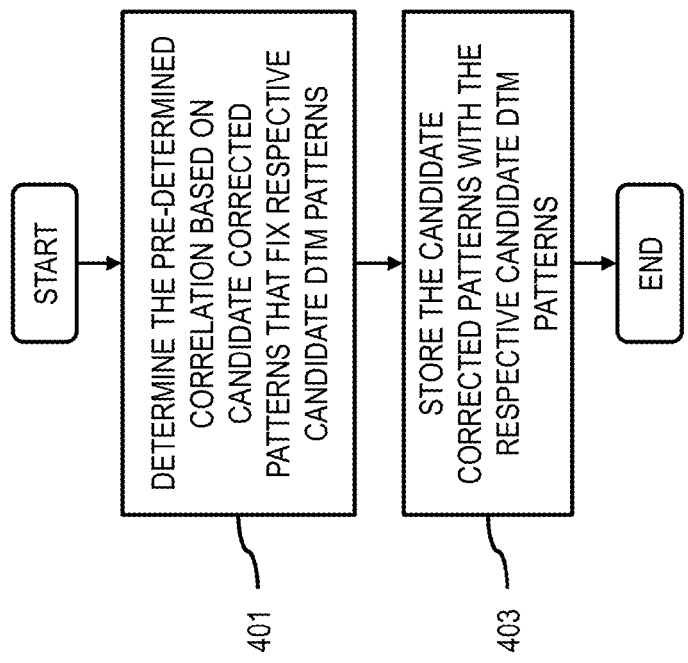
FIG. 4 is a flowchart of a process for determining correlations between candidate corrected patterns and respective candidate difficult-to-manufacture patterns, in accordance with an exemplary embodiment.

FIG. 4 is a flowchart of a process for determining correlations between candidate corrected patterns and respective candidate difficult-to-manufacture patterns, in accordance with an exemplary embodiment. For the process of FIG. 4, the layout correction platform 100 performs the process and is implemented in, for instance, a chip set including a processor and a memory as shown in FIG. 14.

At step 401, the layout correction platform 100 determines a pre-determined correlation based on candidate corrected patterns that fix respective candidate difficult-to-manufacture patterns. The pre-determined correlation may be based on manual efforts, such as human designers determining candidate corrected patterns that fix candidate difficult-to-manufacture patterns, or through semi-automated means, such as human programmed scripts. Many semiconductor design layouts may be checked for locations of layout violations. The patterns associated with the layout violations may be extracted as candidate difficult-to-manufacture patterns, and candidate corrected patterns may be determined for them.

The candidate corrected patterns may then be analyzed to determine if the candidate corrected patterns correct the layout violations. Each candidate corrected pattern is analyzed to determine that there are no new layout violations generated by the candidate corrected pattern, such as design rule check faults at a boundary of the extraction radius. The analysis may use design rule checks to consider (1) the original violation has been resolved, (2) no new violations are generated as a result of the corrected pattern, and (3) boundary checks to ensure that the boundaries of the original layout containing the difficult-to-manufacture pattern and the new layout containing the corrected pattern are the same. This step may be performed in an offline process to build the pattern library 111.

At step 403, the layout correction platform 100 stores the candidate corrected patterns correlated with the respective candidate difficult-to-manufacture patterns. As discussed above, the candidate corrected patterns correlated with the respective candidate difficult-to-manufacture patterns may be stored in the pattern library 111. The candidate corrected patterns may also be stored correlated with the neighboring features of the respective candidate difficult-to-manufacture patterns to account for the neighboring features.

Figure 5:
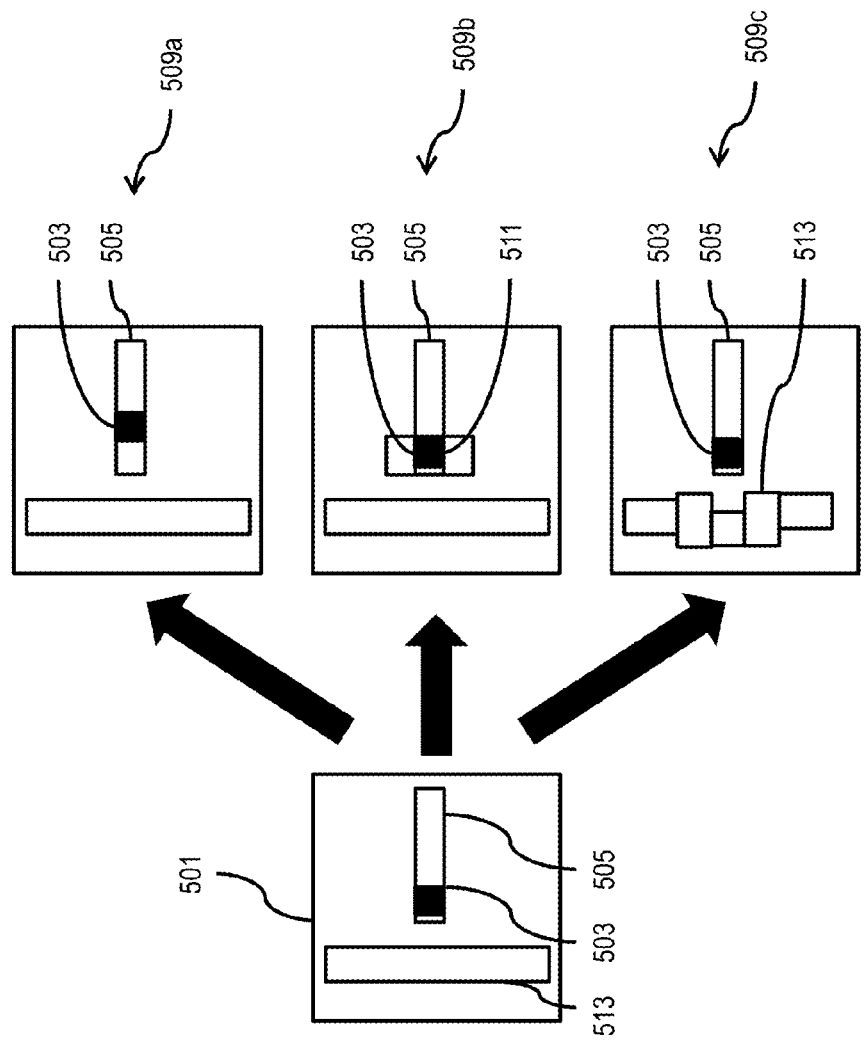
FIGS. 5 through 11 are illustrations of corrections of difficult-to-manufacture patterns, in accordance with various exemplary embodiments.

FIGS. 5 through 11 illustrate various examples of difficult-to-manufacture patterns and the associated corrected patterns. FIG. 5 illustrates a difficult-to-manufacture pattern as a line-end extension patterning hotspot 501 as the vertical interconnect access (VIA) 503 is close to the end of the line 505. The layout correction platform 100 may detect the line-end extension patterning hotspot 501 as a difficult-to-manufacture pattern based on the context-aware pattern detection and an associated pre-determined difficult-to-manufacture pattern. The line-end extension patterning hotspot 501 may be difficult to manufacture because of patterning issues caused by the lithography and etch to form the VIA 503, the line 505, and the vertical metal line 513. Accordingly, the layout correction platform 100 may correct the line-end extension patterning hotspot 501 according to one of the three approaches 509a-509c. As illustrated by approach 509a, the VIA 503 may be moved farther to the right along the line 505 to increase the line-end extension over the VIA 503. As illustrated by approach 509b, a hammerhead end 511 may be added to the left end of the line 505 over the VIA 503. As illustrated by approach 509c, the vertical metal line 513 may be moved away from the VIA 503 so that the patterning issues caused by the lithography and etch can be alleviated.

The corrections presented in FIG. 5 can be characterized for sensitivity to manufacturing yield. The fix with the best manufacturing characteristics may be preserved and stored in the pattern library 111 for consistent implementation and future reuse in an automated pattern-based layout-fixing methodology. Thus, although three fixes are illustrated in FIG. 5, one may be selected and stored as the corrected pattern for the line-end extension patterning hotspot 501. Alternatively, the three corrected patterns within the three approaches 509a-509c may all be saved within the pattern library 111 and may be distinguished from one another as different corrected patterns based on neighboring features of the difficult-to-manufacture pattern within the determined extraction radius. For example, although approach 509c may be generally considered the most effective for sensitivity to manufacturing yield, a neighboring feature within a semiconductor design layout may prevent using approach 509c as a corrected pattern. Instead, a corrected pattern from approach 509a or 509b may be used.

Figure 6:
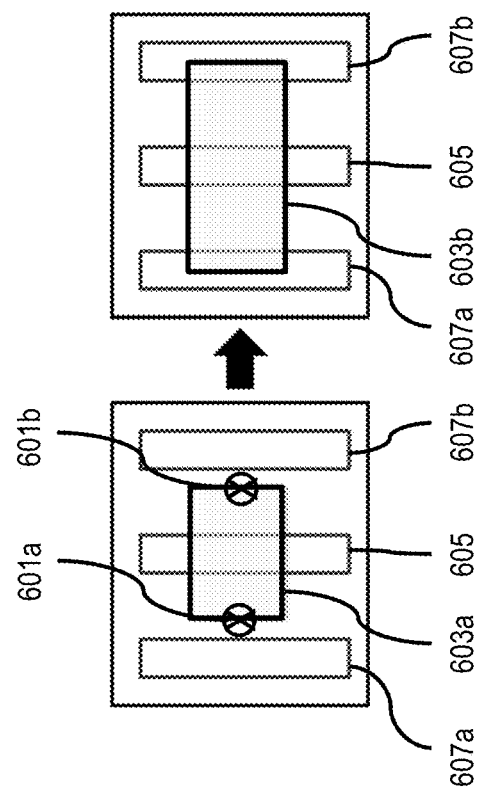

FIG. 6 illustrates active area-tuck hotspots 601a and 601b as another difficult-to-manufacture pattern that may be detected and corrected by the layout correction platform 100. The active area-tuck hotspots 601a and 601b may be created based on edges of the active region 603a extending past the gate 605 but not to the dummy poly areas 607a and 607b. As illustrated, the layout correction platform 100 may correct the difficult-to-manufacture pattern by replacing the difficult-tomanufacture pattern with a corrected pattern that includes the active region 603*b* extending to the dummy poly areas 607*a* and 607*b*, thereby eliminating the active area-tuck hotspots 601*a* and 601*b*.

Figure 7:
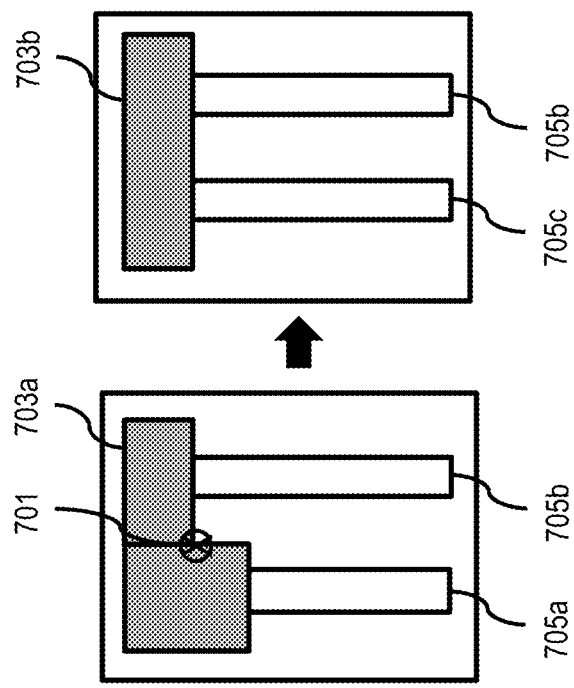

FIG. 7 illustrates a cut-mask generation hotspot 701 as another difficult-to-manufacture pattern that may be detected and corrected by the layout correction platform 100. The cut-mask generation hotspot 701 may be created based on the jog that occurs at the edge of the cut-mask layer 703*a* and the resulting different sized-poly line-ends 705*a* and 705*b*. As illustrated, the layout correction platform 100 may detect the cut-mask generation hotspot 701 as a difficult-to-manufacture pattern and replace it with a corrected pattern. As illustrated, the corrected pattern may include a cut-mask layer 703*b* without the jog in the edge and with equal length poly line-ends 705*b* and 705*c*, thereby removing the cut-mask generation hotspot 701.

Figure 8:
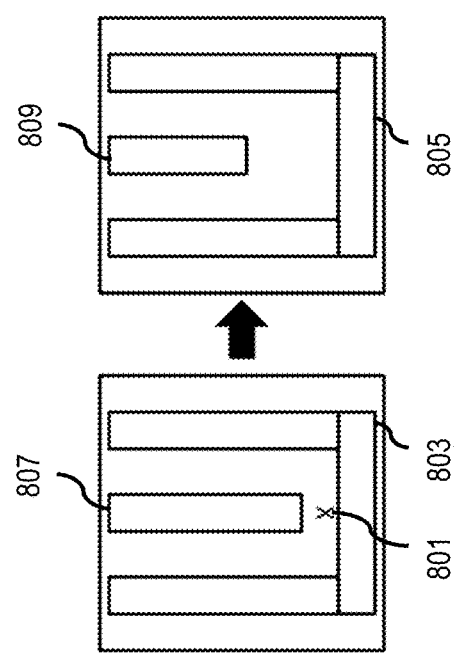

FIG. 8 illustrates another lithography hotspot 801 that may be detected as a difficult-to-manufacture pattern. The lithography hotspot 801 may be susceptible to lithography focus issues, which may cause a pinch at the center of the U-shaped feature 803 due to the association with the proximity between the feature 807 and the U-shaped feature 803. The layout correction platform 100 may detect the pattern that contains the lithography hotspot 801 and replace it with a corrected pattern that contains an increase the spacing between the feature 807 and the U-shaped feature 803, such as by modifying feature 807 to instead be feature 809, which has a larger space between the bottom tip of the feature 809 and the base of the U-shaped feature 805, thereby alleviating the lithography hotspot 801.

Figure 9:
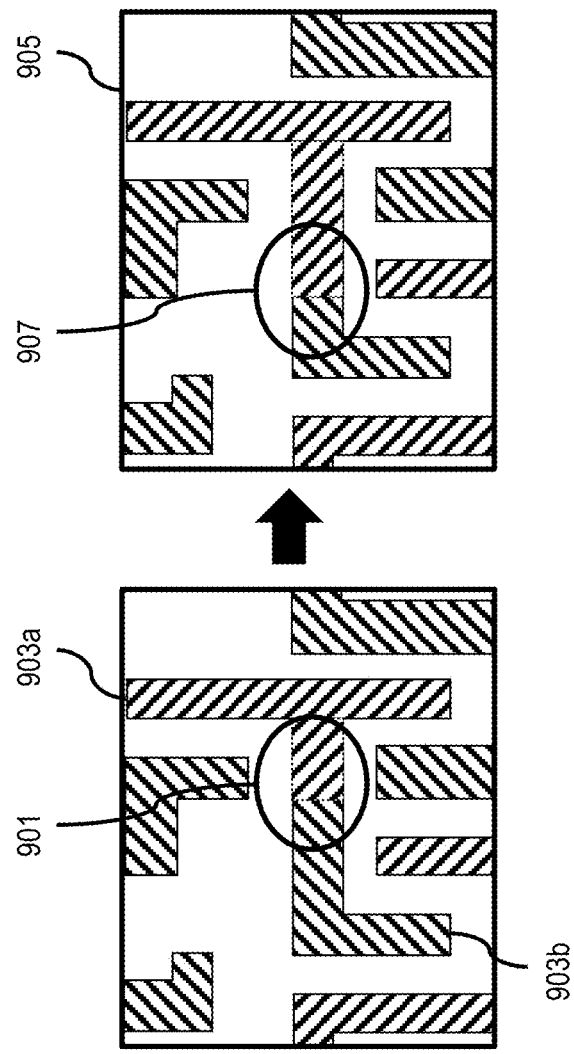

FIG. 9 illustrates another lithography hotspot 901 associated with double pattern technology (DPT) that may be detected as a difficult-to-manufacture pattern. The lithography hotspot 901 may be at a stitch point created by stitching two patterns 903*a* and 903*b* together. The layout correction platform 100 may replace the difficult-to-manufacture pattern with a corrected pattern 905 that includes a stitch point 907 of the two patterns 903*a* and 903*b* shifted to the left.

Figure 10:
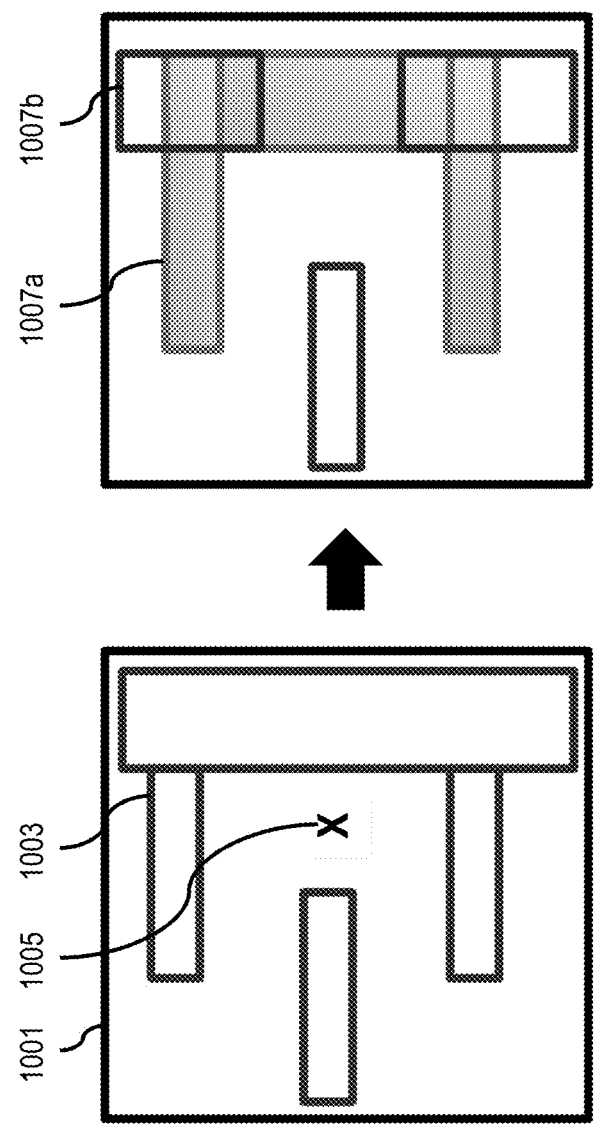

FIG. 10 illustrates a difficult-to-manufacture pattern 1001 that may also be characterized as a difficult-to-decompose pattern. A single mask 1003 may create a hotspot 1005. The layout correction platform 100 may detect the difficult-to-manufacture pattern 1001 and replace the pattern 1001 with two masks 1007*a* and 1007*b* that may be separately processed to prevent the creation of the hotspot 1005. The two masks 1007*a* and 1007*b* may be manually decomposed fixes that may then be preserved in the pattern library 111 and used to find the layout patterns that escaped the automated decomposition algorithms.

Figure 11:
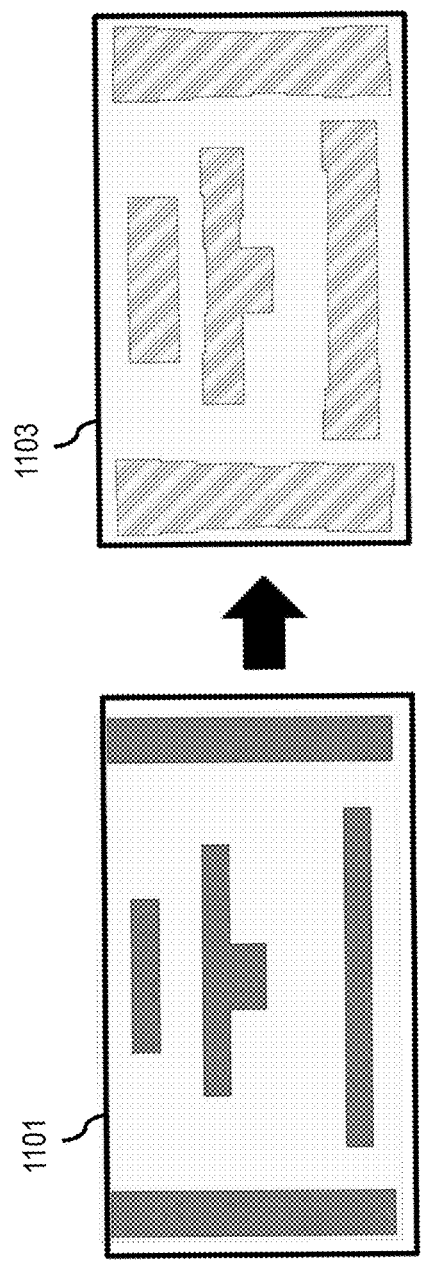

The layout correction platform 100 may also perform optical proximity correction (OPC) optimization. OPC is an iterative process that can be computationally intensive. Pattern detection and replacement has the run-time benefit of rule-based OPC and the accuracy of model-based OPC. The model-based generated OPC solution can be saved as a corrected pattern for subsequent and consistent replacement. FIG. 11 illustrates a difficult-to-manufacture pattern 1101 with the OPC solution 1103. The OPC solution 1103 may be saved in the pattern library 111 for subsequent replacements of the difficult-to-manufacture pattern 1101 rather than having to perform OPC in the future on identical difficult-to-manufacture patterns 1101.

Figure 12:
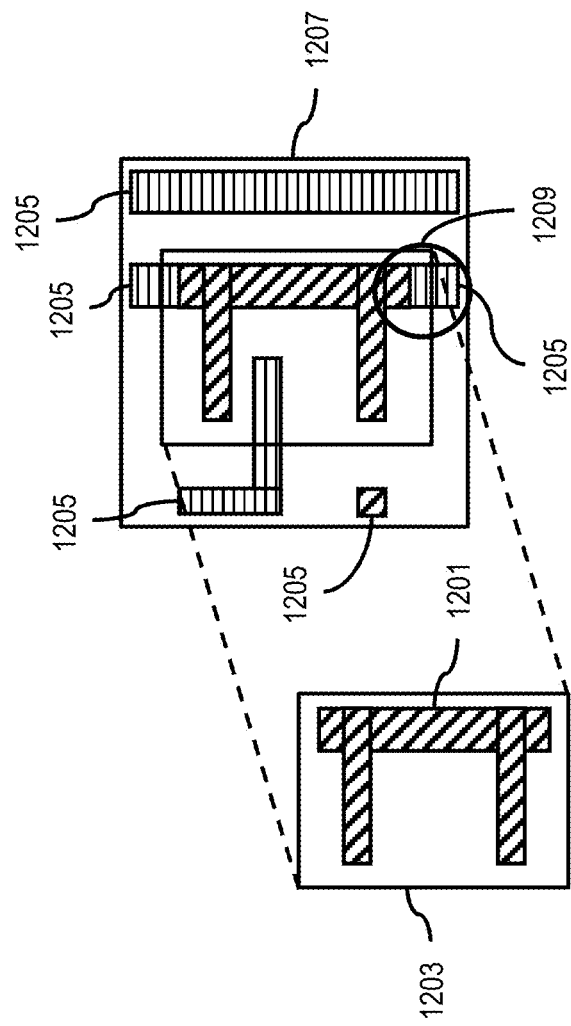
FIG. 12 is an illustration of a context-aware correction of a difficult-to-manufacture pattern, in accordance with an exemplary embodiment.

FIG. 12 is an illustration of a context-aware correction of a difficult-to-manufacture pattern, in accordance with an exemplary embodiment. The pattern 1201 may represent a difficult-to-manufacture pattern that is detected within a drawn semiconductor design layout. Without considering the context of the difficult-to-manufacture pattern 1201, the area 1203 may be determined as an area to be replaced within the layout to correct the difficult-to-manufacture pattern 1201. However, as illustrated, the layout includes neighboring features 1205 to the difficult-to-manufacture pattern 1201. Failure to account for these neighboring features 1205 when replacing the difficult-to-manufacture pattern 1201 may cause additional manufacturing faults, such as lithographic violations. Accordingly, the layout correction platform 100 may determine an extraction radius to account for the neighboring features 1205, as represented by the area 1207. As illustrated, a circled portion 1209 of the layout is within both area 1203 and 1207. Failure to account for the circled portion 1209 may, therefore, cause a new violation that negates any correction. Accordingly, in determining a corrected pattern within the pattern library 111 to correct the difficult-to-manufacture pattern 1201, the layout correction platform 100 will take into account the context of the difficult-to-manufacture pattern 1201 based on the area 1207 determined from the extraction radius.

Figure 13:
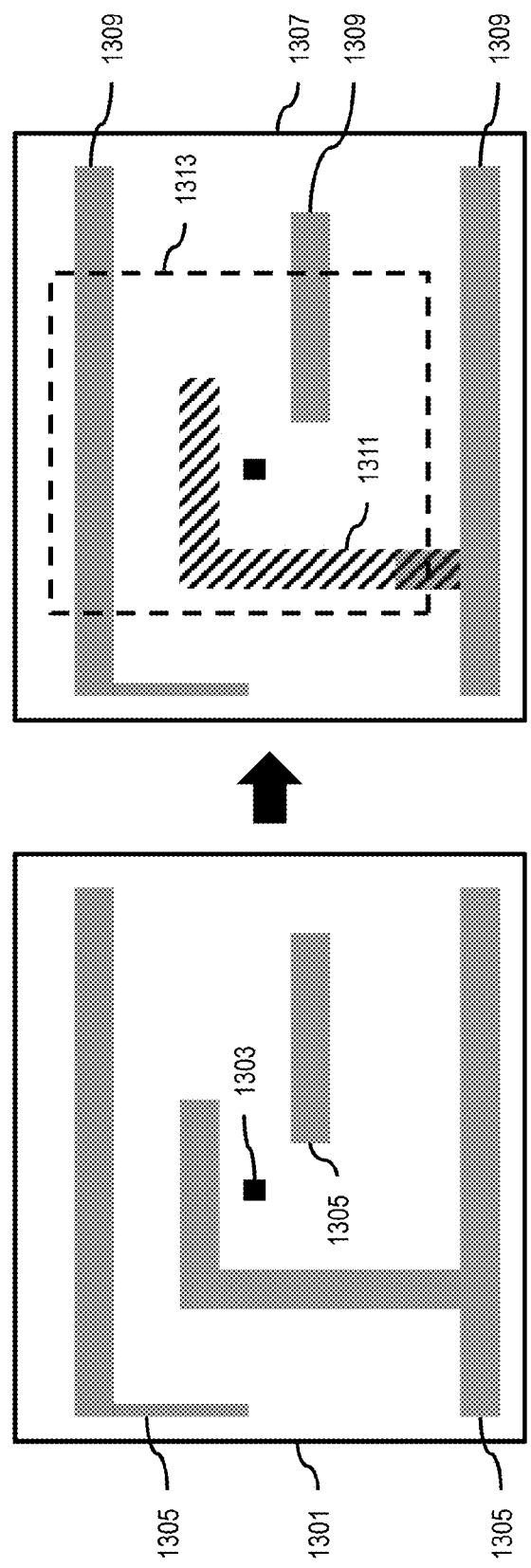
FIG. 13 is an illustration of a validation of a correction of a difficult-to-manufacture pattern, in accordance with an exemplary embodiment.

FIG. 13 is an illustration of a check associated with validating a correction of a difficult-to-manufacture pattern, in accordance with an exemplary embodiment. Specifically, FIG. 13 illustrates a difficult-to-manufacture pattern 1301 that includes a design rule violation 1303 associated with a mask pattern 1305. To correct the difficult-to-manufacture pattern 1301, a candidate corrected pattern 1307 may be created. The candidate corrected pattern 1307 may separate the mask pattern 1305 of the difficult-to-manufacture pattern 1301 into a first mask pattern 1309 and a second mask pattern 1311, which may overlap, as illustrated. Although the candidate corrected pattern 1307 may correct the design rule violation 1303 based on splitting the mask pattern 1305 into two patterns, the candidate corrected pattern 1307 does not satisfy a boundary error check because the second mask pattern 1311 extends beyond the determined boundary 1313 of the boundary error check. Accordingly, the corrected pattern 1307 fails the boundary error check for the difficult-to-manufacture pattern 1301 and is, therefore, not stored within the pattern library 111 as a corrected pattern for the difficult-to-manufacture pattern 1301.

The processes described herein may be implemented via software, hardware, firmware, or a combination thereof. Exemplary hardware (e.g., computing hardware) is schematically illustrated in FIG. 14. As shown, computer system 1400 includes at least one processor 1401, at least one memory 1403, and at least one storage 1405. Computer system 1400 may be coupled to display 1407 and one or more input devices 1409, such as a keyboard and a pointing device. Display 1407 may be utilized to provide one or more GUI interfaces. Input devices 1409 may be utilized by users of computer system 1400 to interact with, for instance, the GUI interfaces. Storage 1405 may store applications 1411, layout data (or information) 1413, design plus rules 1415, and at least one shape database (or repository) 1417. Applications 1411 may include instructions (or computer program code) that when executed by processor 1401 cause computer system 1400 to perform one or more processes, such as one or more of the processes described herein. In exemplary embodiments, applications 1411 may include one or more manufacturability analysis and/or yield enhancement tools.

The embodiments of the present disclosure achieve several technical effects, including an automated context-aware pattern-based layout-correcting methodology that identifies difficult-to-manufacture patterns and replaces them with corrected patterns. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    scanning a drawn semiconductor design layout to determine a difficult-to-manufacture pattern within the drawn semiconductor design layout based on a match with a pre-characterized difficult-to-manufacture pattern;
    determining an extraction radius for determining neighboring features of the difficult-to- manufacture pattern, the extraction radius being based on a radius of influence of manufacturing effects;
    determining a context of the difficult-to-manufacture pattern within the drawn semiconductor design layout based on the neighboring features of the difficult-to-manufacture pattern;
    determining, by a processor, a corrected pattern based on a pre-determined correlation between the corrected pattern and the pre-characterized difficult-to-manufacture pattern and based on the context by accounting for the neighboring features; and
    replacing the difficult-to-manufacture pattern with the corrected pattern within the drawn semiconductor design layout.

2. The method according to claim 1, wherein the extraction radius for lithography hotspots is a lithography optical radius, and the extraction radius for double patterning decomposition-algorithm-related escapes is four times a feature size.

3. The method according to claim 1, wherein the difficult-to-manufacture pattern comprises polygonal data or image data.

4. The method according to claim 1, further comprising:
    determining the pre-determined correlation based on candidate corrected patterns that fix respective candidate difficult-to-manufacture patterns; and
    storing the candidate corrected patterns with the respective candidate difficult-to-manufacture patterns as correlated corrected patterns and pre-characterized difficult-to-manufacture patterns.

5. The method according to claim 4, further comprising determining whether a candidate corrected pattern fixes a candidate difficult-to-manufacture pattern based on correction of an original violation of the candidate difficult-to-manufacture pattern and a determination of no design rule check faults and manufacturing faults generated by the candidate corrected pattern.

6. The method according to claim 5, wherein the design rule check faults are design rule check faults at a boundary of an extraction radius, the extraction radius being based on a radius of influence of manufacturing effects.

7. The method according to claim 1, comprising the difficult-to-manufacture pattern including at least one of a line-end extension hotspot, an active area-tuck hotspot, a cut-mask generation hotspot, a lithography hotspot, a double patterning technology issue, and an optical proximity correction optimization.

8. An apparatus comprising:
    at least one processor; and
    at least one memory including computer program code for one or more programs, the at least one memory and the computer program code configured to, with the at least one processor, cause the apparatus to perform at least the following:
        scan a drawn semiconductor design layout to determine a difficult-to-manufacture pattern within the drawn semiconductor design layout based on a match with a pre-characterized difficult-to-manufacture pattern;
        determine an extraction radius for determining neighboring features of the difficult-to-manufacture pattern, the extraction radius being based on a radius of influence of manufacturing effects;
        determine a context of the difficult-to-manufacture pattern within the drawn semiconductor design layout based on the neighboring features of the difficult-to-manufacture pattern;
        determine a corrected pattern based on a pre-determined correlation between the corrected pattern and the pre-characterized difficult-to-manufacture pattern and based on the context by accounting for the neighboring features; and
        replace the difficult-to-manufacture pattern with the corrected pattern within the drawn semiconductor design layout.

9. An apparatus of claim 8, wherein the extraction radius for lithography hotspots is a lithography optical radius, and the extraction radius for double patterning decomposition-algorithm-related escapes is four times a feature size.

10. An apparatus of claim 8, wherein the difficult-to-manufacture pattern comprises polygonal data or image data.

11. An apparatus of claim 8, wherein the apparatus is further caused, at least in part, to:
    determine the pre-determined correlation based on candidate corrected patterns that fix respective candidate difficult-to-manufacture patterns; and
    store the candidate corrected patterns with the respective candidate difficult-to-manufacture patterns as correlated corrected patterns and pre-characterized difficult-to-manufacture patterns.

12. An apparatus of claim 11, wherein the apparatus is further caused, at least in part, to determine whether a candidate corrected pattern fixes a candidate difficult-to-manufacture pattern based on correction of an original violation of the candidate difficult-to-manufacture pattern and a determination of no manufacturing faults and design rule check faults generated by the candidate corrected pattern.

13. An apparatus of claim 12, wherein the design rule check faults are design rule check faults at a boundary of an extraction radius, the extraction radius being based on manufacturing effects represented by the difficult-to-manufacture pattern.

14. An apparatus of claim 8, wherein the difficult-to-manufacture pattern includes at least one of a line-end extension hotspot, an active area-tuck hotspot, a cut-mask generation hotspot, a lithography hotspot, a double patterning technology issue, and an optical proximity correction optimization.

15. A method comprising:
- scanning a drawn semiconductor design layout to determine a difficult-to-manufacture pattern within the drawn semiconductor design layout;
- determining, by a processor, a match between the difficult-to-manufacture pattern and a pre-characterized difficult-to-manufacture pattern;
- determining an extraction radius for determining neighboring features of the difficult-to-manufacture pattern, the extraction radius being based on a radius of influence of manufacturing effects;
- determining a context of the difficult-to-manufacture pattern within the drawn semiconductor design layout based on the neighboring features of the difficult-to-manufacture pattern;
- deleting a portion of the drawn semiconductor design layout based on the extraction radius and the difficult-to-manufacture pattern; and
- replacing the deleted portion with a corrected portion based on the pre-characterized difficult-to-manufacture pattern.

16. The method according to claim 15, further comprising:
- replacing the difficult-to-manufacture pattern within the deleted portion with a corrected pattern;
- performing a check on the corrected pattern within the deleted portion to ensure a violation associated with the difficult-to-manufacture pattern is corrected; and
- performing another check on the corrected pattern within the deleted portion to ensure no new design rule violations and manufacturing faults are generated.

* * * * *